United States Patent [19]

Stahlhofen

[11] Patent Number: 4,639,406
[45] Date of Patent: Jan. 27, 1987

[54] LIGHT-SENSITIVE COMPOUND, LIGHT-SENSITIVE MIXTURE, AND LIGHT-SENSITIVE COPYING MATERIAL PREPARED THEREFROM WITH 0-NAPHTHOQUINONE DIAZIDE COMPOUND

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 313,232

[22] Filed: Oct. 20, 1981

[30] Foreign Application Priority Data

Oct. 24, 1980 [DE] Fed. Rep. of Germany ....... 3040156

[51] Int. Cl.$^4$ .......... G03C 1/54; G03C 1/94; G07C 113/00
[52] U.S. Cl. .................. 430/165; 430/192; 430/193; 430/302; 430/326; 534/557
[58] Field of Search ........... 430/193, 192, 165, 326, 430/302; 260/141 D; 534/557

[56] References Cited

U.S. PATENT DOCUMENTS

| | | | |
|---|---|---|---|
| 3,635,709 | 1/1972 | Kobayashi | 430/192 |
| 4,036,644 | 7/1977 | Kaplan | 430/191 |
| 4,174,222 | 11/1979 | Komine et al. | 430/190 |
| 4,266,001 | 5/1981 | Buhr et al. | 430/192 |

FOREIGN PATENT DOCUMENTS 1078105 11/1964 United Kingdom .

*Primary Examiner*—Charles L. Bowers, Jr.
*Attorney, Agent, or Firm*—Schwartz, Jeffery, Schwaab, Mack, Blumenthal & Evans

[57] ABSTRACT

A light-sensitive copying material for the preparation of printing plates and photoresists is described, which material contains, as the light-sensitive compound, a naphthoquinone-diazide-sulfonic acid ester of the general formula I

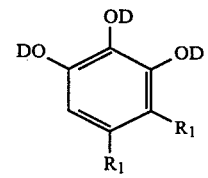

in which D is a 1,2-naphthoquinone-2-diazide-4-sulfonyl radical or a 1,2-naphthoquinone-2-diazide-5-sulfonyl radical, $R_1$ is a hydrogen atom or a —$COC_nH_{2n+1}$ radial, and $R_2$ is a hydrogen atom or a —CO—$OC_nH_{2n+1}$ radial, n being a number from 10 to 25 and the sum of the carbon atoms of $R_1 + R_2$ being $n+1$.

The new quinone-diazides are distinguished by a higher solubility and a greater resistance to developer.

7 Claims, No Drawings

LIGHT-SENSITIVE COMPOUND, LIGHT-SENSITIVE MIXTURE, AND LIGHT-SENSITIVE COPYING MATERIAL PREPARED THEREFROM WITH 0-NAPHTHOQUINONE DIAZIDE COMPOUND

This invention relates to a positive-working light-sensitive mixture which contains a water-insoluble resinous binder, which is soluble or swellable in aqueous-alkaline solutions, and, as the light-sensitive compound, a naphthoquinone-diazide-sulfonic acid ester of a substituted pyrogallol.

Japanese Laid-Open Application No. 51/139,402, discloses the use of esters obtained from 3 moles of 1,2-naphthoquinone-2-diazide-sulfonic acids and 1 mole of gallic acid alkyl esters, having 2 to 5 carbon atoms in the alkyl group, in combination with novolaks for the preparation of positive-working light-sensitive materials, in particular photoresist layers. The quinone-diazides described in that publication are said to be distinguished by a high light sensitivity and a good solubility in organic solvents. Although the solubility is improved by comparison with quinone-diazides hitherto used for the preparation of offset printing plates, it is still inadequate for many purposes, and there is always a tendency of such compounds to crystallize out, on prolonged standing, from the coating solutions which are prepared and used on a large scale. As a result, the uniformity of the copying layers obtained is significantly impaired. This disadvantage manifests itself particularly in coating processes in which coating solutions of relatively high concentration must be used, for example in the case of coating by means of a gravure coater.

It is the object of the present invention to provide a light-sensitive mixture of the generic type indicated at the outset, which is based on novel 1,2-naphthoquinone-2-diazide-sulfonic acid esters having a higher solubility in organic solvents and which should be at least comparable, in all technological properties in printing and copying, with the best hitherto known mixtures. The compounds also have an oleophilic character which is more pronounced than that of the known compounds, and they are easy to prepare.

The starting point of the present invention is a light-sensitive mixture which contains a 1,2-naphthoquinone-2-diazide-4- or -5-sulfonic acid ester of a gallic acid alkyl ester or of a pyrogallyl alkyl ketone and a water-insoluble resinous binder which is soluble or at least swellable in aqueous-alkaline solutions.

The light-sensitive mixture according to the invention comprises a naphthoquinone-diazide-sulfonic acid ester of the general formula I

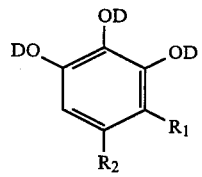

in which D is a 1,2-naphthoquinone-2-diazide-4-sulfonyl radical or, preferably, a 1,2-naphthoquinone-2-diazide-5-sulfonyl radical, $R_1$ is a hydrogen atom or a —$COC_nH_{2n+1}$ radical, and $R_2$ is a hydrogen atom or a —CO—$OC_nH_{2n+1}$ radical, n being an integer from 10 to 25 and the sum of the carbon atoms of $R_1+R_2$ being $n+1$.

The o-quinone-diazides used in the mixture according to the invention are novel. They are prepared analogously to known processes, by esterifying the phenolic groups with the corresponding o-quinone-diazide-sulfonic acids or reactive derivatives thereof, for example the sulfonic acid chlorides.

The long-chain 4-acyl-pyrogallols are advantageously obtained by reacting pyrogallol with the corresponding long-chain carboxylic acid at 130°–150° C. in the presence of anhydrous zinc chloride (Nencki reaction). The long-chain alkyl esters are prepared in good yield by esterifying, 3,4,5-trihydroxy-benzoic acid with the higher aliphatic alcohols. n-Dodecyl gallate can, for example, be readily prepared by the method of van der Kerk, Verbeck and Cleton (described in Recueil des travaux chimiques des Pays-Bas 70 (1951), 277), by boiling a mixture of 1 mole of gallic acid and 5 moles of n-dodecyl alcohol in xylene for several hours, in the presence of p-toluenesulfonic acid. The water of reaction, which is formed, is removed azeotropically from the equilibrium, with the aid of a water separator. (See also "Houben-Weyl"; Methoden der organischen Chemie (*Methods of Organic Chemistry*), 4th Edition, Volume VIII, page 524). The esterification with even higher alcohols, for example n-octadecyl alcohol, is more advantageously carried out by boiling in anisole for several hours, in the presence of nitrobenzene. The proportion of nitrobenzene should be equivalent to the acid which is to be esterified. In this case also, p-toluene sulfonic acid is an effective catalyst. In general, the alkyl esters are preferred to the alkyl ketones, because they are easier to prepare.

The concentration of the new naphthoquinone-diazide-sulfonic acid esters in the light-sensitive layer can vary within relatively wide limits. In general, the proportion is 3 to 50 percent, preferably between 7 and 25 percent, based upon the weight of the solids fraction of the light-sensitive mixture.

The light-sensitive mixtures according to the invention also contain a polymeric, water-insoluble resinous binder which dissolves in the solvent used for the mixture according to the invention, and is also soluble or at least swellable in aqueous alkalies.

The novolak condensation resins, which are suitable in many positive-copying materials based on naphthoquinone-diazides, were found to be particularly useful and advantageous as an additive also in the mixtures according to the present invention, which contain the novel naphthoquinone-diazide-sulfonic acid esters. They promote a sharp differentiation between the exposed an unexposed layer areas on developing, and this is particularly true of the more highly condensed resins with substituted phenols, for example cresols, as the partners for the condensation with formaldehyde. Further alkali-soluble binders, or binders which are swellable in alkali, are natural resins, such as shellac and colophony, and synthetic resins, such as copolymers of styrene and maleic anhydride or copolymers of acrylic acid or methacrylic acid, in particular with acrylates or methacrylates.

The nature and quantity of the alkali-soluble resin can differ, depending on the intended purpose; proportions of between 95 and 50, particularly preferably 90–65, percent by weight based upon total solids are preferred. Additionally, numerous other resins also can be co-used, preferably epoxides and vinyl polymers, such as polyvinyl acetates, polyacrylates, polyvinyl acetals, polyvinyl ethers, polyvinylpyrrolidones and the copolymers of the monomers on which these are based. The most advantageous proportion of these resins depends upon the technological requirements and the influence on the development conditions, and in general it is not more than 20 percent by weight of the alkali-soluble resin. For special requirements, such as flexibility, adhesion, gloss, coloration and color change and the like, the light-sensitive mixture also can contain small quantities of substances, such as polyglycols, cellulose derivatives, such as ethylcellulose, wetting agents, dyes, adhesion-promoters and finely divided pigments, and also UV absorbers, if required.

To coat a suitable support, the mixtures are in general dissolved in a solvent. The selection of the solvents should be matched to the intended coating process, the layer thickness and the drying conditions. Ketones, such as methyl ethyl ketone, chlorinated hydrocarbons, such as trichloroethylene and 1,1,1-trichloroethane, alcohols, such as n-propanol, ethers, such as tetrahydrofuran, alcohol-ethers, such as ethylene glycol monoethyl ether, and esters, such as butyl acetate, are suitable solvents for the mixture according to the invention. It is also possible to use mixtures which additionally, for special purposes, also can contain solvents, such as acetonitrile, dioxane or dimethylformamide. Partial ethers of glycols, especially ethylene glycol monomethyl ether, are particularly preferred.

In most cases, metals are used as the supports for layer thicknesses of less than about 10 μm. The following can be used for offset printing plates: bright-rolled, mechanically or electrochemically roughened and, if appropriate, anodized aluminum which also can have been additionally pretreated chemically, for example with polyvinylphosphonic acid, silicates or phosphates, and also multi-metal plates, for example those of Al/Cu/Cr or brass/chromium. For the preparation of letterpress plates, the mixtures according to the invention can be applied to zinc or magnesium plates, or to commercially available microcrystalline alloys thereof, for single-stage etching processes, and also to etchable plastics, such as polyoxymethylene. Due to their good adhesion and etch resistance on copper and nickel surfaces, the mixtures according to the invention are suitable for gravure printing forms or screen-printing forms. Likewise, the mixtures according to the invention can be used as photoresists in the manufacture of printed circuit boards and in chemical milling.

In further applications, other supports, such as wood, paper, ceramics, textiles and other metals also can be used.

The preferred supports for thick layers of more than 10 μm are plastic films which then serve as temporary supports for transfer layers. For this purpose and for color-test films, polyester films, for example those of polyethylene terephthalate, are preferred. However, polyolefin films, such as polypropylene, are also suitable.

Coating of the support material is carried out in a known manner by whirler-coating, spraying, dipping, rolling, by means of slot dies, or doctor blade application. Finally, the coating of, for example, printed circuit boards, glass or ceramics and silicon disks, also can be effected by layer transfer from a temporary support.

The light sources customary in industry are used for exposure. Electron or laser irradiation is also a possibility for providing an image.

The aqueous-alkaline solutions of stepped alkalinity, which are used for developing and which also can contain minor amounts of organic solvents or wetting agents, remove those areas of the copying layer which have been struck by the light, and thus produce a positive image of the original.

The preferred use of the light-sensitive mixtures according to the invention is in the preparation of printing forms, that is to say in particular offset printing forms, autotype gravure printing forms and screen-printing forms, in photoresist solutions and in so-called dry-resists.

The printing plates prepared with the use of the novel compounds have a high light sensitivity in practice and an improved resistance to alkaline developers. The preferred compounds themselves are distinguished by good to excellent solubility in the customary solvents, by a good oleophilic character and by good compatibility with the other constituents of the copying layer.

The remarkably good solubility of the naphthoquinone-diazide-sulfonic acid esters according to the invention, which contain a long-chain aliphatic substituent in the molecule, as described above, in the preferred coating solvents becomes clear when, at the same state of crystallinity, the solubility is compared with the corresponding known quinone-diazides which are substituted by a relatively small aliphatic radical. A comparison of the solubility in ethylene glycol monomethyl ether (EGMME) and in butyl acetate is shown in the following summary:

| Compound of formula I with | | Solubility in % by weight at 23° C. in | |
|---|---|---|---|
| | | Butyl acetate | EGMME |
| $R_2 = H$ | n = 2 | 0.166 | 0.830 |
| | n = 15 | >50.00 | >50.00 |
| | n = 17 | >50.00 | >50.00 |
| $R_1 = H$ | n = 1 | 1.50 | 3.40 |
| | n = 4 | 1.50 | 5.60 |
| | n = 18 | 8.53 | >50.00 |

A further advantage of the novel light-sensitive tris-naphthoquinone-diazide-sulfonic acid esters is that, due to the long-chain aliphatic substituent, the sensitivity to shock and the explosibillity are substantially reduced, so that these compounds can be classified into a less hazardous risk category. Tris-esters with a similar position of the quinone-diazide groups in the molecule but with a spatially relatively small substituent, for example the ester obtained from 1 mole of 2,3,4-trihydroxy-benzophenone and 3 moles of 1,2-naphthoquinone-2-diazide-5-sulfonic acid, are explosives according to the definition given in the German Explosives Act and are thus also ranked in a very unfavorable risk category for transport.

The invention will be further illustrated by reference to the examples which follow and in which parts by weight (p.b.w.) and parts by volume (p.b.v.) have the same relationship as the g to the ml. Unless otherwise stated, percentages are percent by weight.

EXAMPLE 1

1.27 parts by weight of the esterification products obtained from 1 mole of 4-octadecanoyl-pyrogallol and 3 moles of 1,2-naphthoquinone-2-diazide-5-sulfonic acid chloride (decomposition point 120°–125° C.), 0.10 part by weight of 1,2-naphthoquinone-2-diazide-4-sulfonic acid chloride, 5.60 parts by weight of a cresol/formaldehyde novolak having a softening point of 105°–120° C., 0.43 part by weight of 2,3,4-trihydroxy-benzophenone, and 0.06 part by weight of crystal violet were dissolved in a solvent mixture of 30 parts by weight of ethylene glycol monomethyl ether, 40 parts by weight of tetrahydrofuran, and 10 parts by weight of butyl acetate.

An electrolytically roughened and anodized aluminum plate having an oxide weight of 3.0 g/m² was coated with this solution. Before application of the light-sensitive copying layer, the anodized aluminum support had been treated with an aqueous solution of polyvinylphosphonic acid, as described in German Pat. No. 1,621,478.

The presensitized material thus prepared, the layer weight of the light-sensitive layer being about 2.40 g/cm², was exposed imagewise under a transparent positive original and then developed using the following solution:

5.4 parts by weight of sodium metasilicate×9 water, 3.4 parts by weight of trisodium phosphate×12 water, and 0.3 part by weight of sodium dihydrogen phosphate (anhydrous) in 91.0 parts by weight of water.

All of the portions of the copying layer struck by the light were removed by the development, and the unexposed image areas, which formed the printing stencil, remained on the support. On an offset printing press, approximately 200,000 perfect prints were obtained from the printing form thus prepared.

If, in the formulation indicated above, the naphthoquinone-diazide-sulfonic acid ester of 4-octadecanoyl-pyrogallol was replaced by the corresponding ester of a short-chain acyl-pyrogallol, for example 4-propionyl-pyrogallol, and a printing form was prepared in the manner indicated, this form was of substantially poorer quality.

While the printing stencil which contained the long-chain acyl radical in the naphthoquinone-diazide-sulfonic acid ester was still perfect even after five minutes' action of the developer at room temperature, the screen dots of the corresponding printing stencil with the compound containing the short-chain acyl radical already had been extensively attacked after one minute's action of the developer. After five minutes, the entire printing stencil had then been detached from the aluminum support, except for small residual quantities.

The less pronounced oleophilic character of the printing stencil and the relatively short print run were also noticeable, as compared with the printing plate prepared in accordance with Example 1.

The substantially better solubility of the quinone-diazide with a long-chain acyl radical in the molecule, as compared with the same compound having a short-chain acyl radical, already has been pointed out.

In Examples 2 to 5 which follow, further coating solutions are described, which give similar results. Unless separately noted, the preparation and processing of the planographic printing plates thus obtained correspond to the conditions described in Example 1.

EXAMPLE 2

1.30 parts by weight of the esterification product obtained from 1 mole of dodecyl-3,4,5-trihydroxybenzoate and 3 moles of 1,2-naphthoquinone-2-diazide-5-sulfonic acid chloride (decomposition point 115°–120° C.), 5.60 parts by weight of the novolak employed in Example 1, 0.12 part by weight of 4-(p-tolylmercapto)-2,5-diethoxy-benzene-diazonium hexafluorophosphate, 0.44 part by weight of 2,3,4-trihydroxy-benzophenone and 0.065 part by weight of crystal violet were dissolved in a solvent mixture of 40 parts by weight of ethylene glycolmonomethyl ether and 50 parts by weight of tetrahydrofuran.

An electrolytically roughened and anodized aluminum plate which previously had been treated with an aqueous solution of polyvinylphosphonic acid was coated with this solution.

EXAMPLE 3

1.26 parts by weight of the esterification product obtained from 1 mole of 4-hexadecanoyl-pyrogallol and 3 moles of 1,2-naphthoquinone-2-diazide-5-sulfonic acid chloride (decomposition point 120°–125° C.), 5.60 parts by weight of the novolak employed in Example 1, 0.10 part by weight of 2-(4-methoxy-naphth-1-yl)-4,6-bis-trichloromethyl-s-triazine, 0.40 part by weight of 2,4-dihydroxy-benzophenone and 0.06 part by weight of crystal violet were dissolved in a solvent mixture of 80 parts by weight of ethylene glycol monomethyl ether and 20 parts by weight of butyl acetate.

An electrolytically roughened and anodized aluminum plate was coated with this solution in such a way that a layer weight of 2.0 g/m² was obtained.

EXAMPLE 4

1.10 parts by weight of the esterification product obtained from 1 mole of octadecyl-3,4,5-trihydroxybenzoate and 3 moles of 1,2-naphthoquinone-2-diazide-5-sulfonic acid chloride (decomposition point 105°–112° C.), 5.90 parts by weight of the novolak employed in Example 1, 0.10 part by weight of 1,2-naphthoquinone-2-diazide-4-sulfonic acid chloride, 0.27 part by weight of 2,3,4-trihydroxy-benzophenone and 0.06 part by weight of crystal violet were dissolved in a mixture of 80 parts by weight of ethylene glycol monomethyl ether, and 20 parts by weight of butyl acetate.

An electrolytically roughened and anodized aluminum plate which, before application of the copying layer, had been treated with an aqueous solution of polyvinylphosphonic acid was coated with this solution.

EXAMPLE 5

This example describes a copying layer solution which can be used as a positive-acting photoresist composition for various purposes, in particular for the preparation of etch stencils, for example in chemical milling, in the etching of labels and in the manufacture of copied circuits, in particular for micro-electronics. The solution had a long life. The type of coating and the layer thickness can be adapted to the particular requirements within wide limits. After exposure, the exposed areas were differentiated with sharp contrast from the unexposed areas. Using an alkaline developer (pH about 12.8), the exposed areas could be removed without difficulty.

Coating solution:
1.5 parts by weight of the esterification product obtained from 1 mole of dodecyl-3,4,5-trihydroxybenzoate and 3 moles of 1,2-naphthoquinone-2-diazide-5-sulfonic acid chloride (decomposition point 115°–120° C.),
0.4 part by weight of 4-(p-tolylmercapto)-2,5-diethoxy-benzene-diazonium hexafluorophosphate,
0.1 part by weight of crystal violet (C. I. 42,555),
10.0 parts by weight of the novolak employed in Example 1, and
2.0 parts by weight of an epoxy resin having an epoxy equivalent weight of 450–500 and a melting range of 64°–74° C. in
40 parts by volume of ethylene glycol monomethyl ether,
50 parts by volume of tetrahydrofuran and
10 parts by volume of butyl acetate.

A plate of an insulating material, laminated with a 35 μm thick copper foil, was coated with this solution.

EXAMPLE 6

1.30 parts by weight of the esterification product obtained from 1 mole of dodecyl-3,4,5-trihydroxylbenzoate and 3 moles of 1,2-naphthoquinone-2-diazide-4-sulfonic acid chloride (decomposition point 105°–110° C.),
5.80 parts by weight of the novolak employed in Example 1,
0.16 part by weight of 1,2-naphthoquinone-2-diazide-4-sulfonic acid chloride,
0.10 part by weight of 2,3,4-dihyroxy-benzophenone and
0.065 part by weight of crystal violet
were dissolved in a solvent mixture of
60 parts by weight of ethylene glycol monomethyl ether and
30 parts by weight of butyl acetate.

An electrolytically roughened and anodized aluminum plate which had been post-treated with an aqueous solution of polyvinylphosphonic acid was coated with this solution.

EXAMPLE 7

1.200 parts by weight of the esterification product obtained from 1 mole of tetradecyl-3,4,5-trihydroxybenzoate and 3 moles of 1,2-naphthoquinone-2-diazide-5-sulfonic acid chloride (decomposition point 105°–110° C.),
5.900 parts by weight of the novolak indicated in Example 1,
0.160 part by weight of 1,2-naphthoquinone-2-diazide-4-sulfonic acid chloride and
0.065 part by weight of crystal violet
were dissolved in the solvent mixture of
40 parts by weight of ethylene glycol monomethyl ether and
50 parts by weight of butyl acetate.

An electrolytically roughened and anodized aluminum plate was coated with this solution.

It will be obvious to those skilled in the art that many modifications may be made within the scope of the present invention without departing from the spirit thereof, and the invention includes all such modifications.

What I claim is:

1. A light-sensitive mixture which contains a 1,2-naphthoquinone-2-diazide-4- or -5-sulfonic acid ester of a gallic acid alkyl ester or of a pyrogallyl alkyl ketone and a water-insoluble resinous binder, which is soluble or at least swellable in aqueous-alkaline solutions, wherein the naphthoquinone diazide sulfonic acid ester corresponds to the general formula I

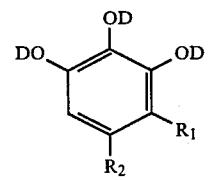

in which D is a 1,2-naphthoquinone-2-diazide-4-sulfonyl radical or a 1,2-naphthoquinone-2-diazide-5-sulfonyl radical, $R_1$ is a hydrogen atom or a $-COC_nH_{2n+1}$ radical, and $R_2$ is a hydrogen atom or a $-CO-OC_nH_{2n+1}$ radical, n being an integer from 10 to 25 and the sum of the carbon atoms of $R_1+R_2$ being $n+1$.

2. A light-sensitive mixture as claimed in claim 1 which contains a phenolic resin novolak as the alkali-soluble binder.

3. A light-sensitive mixture as claimed in claim 1 which contains about 3 to 50 percent by weight, based upon its content of non-volatile constituents, of compounds of formula I.

4. A light-sensitive copying material, composed of a support and a light-sensitive layer which contains a 1,2-naphthoquinone-2-diazide-4- or -5-sulfonic acid ester of a gallic acid alkyl ester or of a pyrogallyl alkyl ketone and a water-insoluble resinous binder, which is soluble or at least swellable in aqueous-alkaline solutions, wherein the naphthoquinone diazide sulfonic acid ester corresponds to the general formula I

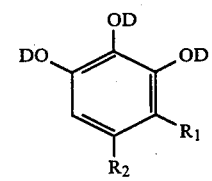

in which D is a 1,2-naphthoquinone-2-diazide-4-sulfonyl radical or a 1,2-naphthoquinone-2-diazide-5-sulfonyl radical, $R_1$ is a hydrogen atom or a $-COC_nH_{2n+1}$ radical, and $R_2$ is a hydrogen atom or a $-CO-OC_nH_{2n+1}$ radical, n being an integer from 10 to 25, and the sum of the carbon atoms of $R_1+R_2$ being $n+1$.

5. A light-sensitive copying material as claimed in claim 4 wherein the support is composed of aluminum, the surface of which has been mechanically or electrolytically roughened and anodically oxidized.

6. A 1,2-naphthoquinone-2-diazide-4- or -5-sulfonic acid ester of a gallic acid alkyl ester or of a pyrogallyl alkyl ketone, wherein the sulfonic acid ester corresponds to the general formula I

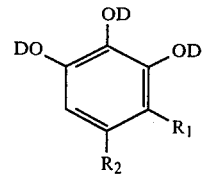

in which D is a 1,2-naphthoquinone-2-diazide-4-sulfonyl radical or a 1,2-naphthoquinone-2-diazide-5-sulfonyl radical, $R_1$ is a hydrogen atom or a $-COC_nH_{2n+1}$ radical, and $R_2$ is a hydrogen atom or a $-CO-CO_nH_{2n+1}$ radical, n being an integer from 10 to 25, and the sum of the carbon atoms of $R_1+R_2$ being $n+1$.

7. Dodecyl-3,4,5-tris-(1,2-naphthoquinone-2-diazide-5-sulfonyloxy)-benzoate.

* * * * *